United States Patent [19]

Nakamura

[11] Patent Number: 4,678,938
[45] Date of Patent: Jul. 7, 1987

[54] SOLID-STATE IMAGE SENSING APPARATUS HAVING AN AUTOMATIC CONTROL LOOP

[75] Inventor: Junichi Nakamura, Nagano, Japan

[73] Assignee: Olympus Optical Co., Ltd., Tokyo, Japan

[21] Appl. No.: 772,787

[22] Filed: Sep. 5, 1985

[30] Foreign Application Priority Data

Sep. 28, 1984 [JP] Japan ................ 59-203718

[51] Int. Cl.⁴ ............ H03K 3/42; H01L 29/78; H01L 27/14; H01J 40/14
[52] U.S. Cl. ............ 307/311; 357/24; 357/30; 250/578; 358/213.12
[58] Field of Search ........ 357/24, 30; 377/57–63; 307/311; 250/578; 358/213

[56] References Cited

U.S. PATENT DOCUMENTS

| | | | |
|---|---|---|---|
| 4,387,402 | 6/1983 | Lewis | 358/213 |
| 4,524,391 | 6/1985 | Nishizawa et al. | 357/24 LR |
| 4,525,742 | 6/1985 | Nishizawa et al. | 357/24 LR |
| 4,556,909 | 12/1985 | Yamada | 357/24 LR |
| 4,562,474 | 12/1985 | Nishizawa | 357/30 |

Primary Examiner—Gene M. Munson
Attorney, Agent, or Firm—Armstrong, Nikaido, Marmelstein & Kubovcik

[57] ABSTRACT

A solid-state image sensing apparatus employs normally-ON type static induction transistors to constitute picture elements. Some of the picture elements are shielded from light so as to serve as light-shielded picture elements. The apparatus is provided with an automatic control loop which controls the voltage level of each of the row selecting signals in accordance with the output of the corresponding light-shielded picture element, whereby the voltage level of each row selecting signal is automatically controlled in such a manner that the output of the corresponding light-shielded picture element becomes zero. Thus, it is possible to obtain a video output which includes no offset nor dark output without decreasing the dynamic range.

5 Claims, 23 Drawing Figures

DARK OUTPUT+OFFSET

SOLID-STATE IMAGE SENSING APPARATUS HAVING AN AUTOMATIC CONTROL LOOP

BACKGROUND OF THE INVENTION

The present invention relates to a solid-state image sensing apparatus which employs as image sensing elements static induction transistors, which have a versatility that enables them to serve as photoelectric transducers, amplifying elements and switching elements.

Conventional solid-state image sensing apparatuses which are widely utilized employ charge-transfer devices such as charge-coupled devices (CCDs) or MOS transistors. Such conventional image sensing apparatuses, however, suffer from the following problems: charges may undesirably leak out when they are transferred; the light-detecting sensitivity is disadvantageously low; and it is not possible for the degree of integration to be increased.

Novel solid-state image sensing apparatuses employing static induction transistors (referred to simply as "SITs", hereinafter) have been proposed to overcome the above-described problems. For example, the specification of Japanese Patent Laid-Open No. 15229/1980 discloses a solid-state image sensing apparatus in which SITs are arranged in a matrix, and the source, drain and gate of each of the SITs are, respectively, connected to a row line, a column line and a clear line.

Another type of conventional solid-state image sensing apparatus employs normally-OFF type SITs which are OFF when the gate bias is zero. This type of image sensing apparatus advantageously makes it possible to obtain a spike-shaped signal with a large amplitude since a signal is read within the charge injecting region. However, in this apparatus, the practically available range of SIT gate potentials at the time of reading is inconveniently narrow, that is, from the positive pinch-off voltage at which an SIT starts to turn ON to the gate voltage at which the injection of charges takes place from the gate to the source, which fact involves a disadvantageously narrow range of handleable quantities of incident light. In consequence, the amount of saturation exposure is unfavorably small.

In order to solve such a problem, a solid-state image sensing apparatus has been developed which employs normally-ON type SITs, which are ON when the gate bias is zero. FIG. 1(A) is a sectional view of an SIT which constitutes one picture element in a solid-state image sensing apparatus which employs normally-ON type SITs, the apparatus being disclosed in the specification of Japanese patent application No. 165237/1983 (Japanese Patent Laid-Open No. 58781/1985) previously submitted to the Japanese Patent Office by the applicant of the present invention and in the specification of U.S. Pat. No. 4,556,909 previously submitted to the Patent and Trademark Office of the U.S. Department of Commerce by yamada and assigned to the same assignee. FIG. 1(B) shows the general circuit configuration of one embodiment of the prior art apparatus, and FIG. 1(C) is a waveform chart of signals employed to operate the apparatus shown in FIG. 1(B).

As shown in FIG. 1(A), an SIT includes an $n^+$ silicon substrate 1 which constitutes a drain. An $n^-$ silicon epitaxial layer 2 with a low impurity density is grown on the substrate 1. Then, an $n^+$ source region 3 and $p^+$ gate regions 4, 4 are formed on the surface of the epitaxial layer 2 by thermal diffusion or other similar method. An insulator film 5 such as $SiO_2$ is deposited on each gate region 4, and a gate electrode 6 is deposited on the insulator film 5, whereby a capacitor 7 is formed by the insulator film 5 and the gate electrode 6. A reference numeral 8 denotes a gate terminal which is connected to both the gate electrodes 6, 6. The numeral 9 represents an isolation region made of, for example, a buried insulator, by which unit SITs respectively constituting picture elements are isolated from each other. The $n^-$ epitaxial layer 2 constitutes the channel region of the SIT. Since the SIT is of the normally-ON type, it is possible for the distance $W_g$ between the gate regions 4, 4 to be made relatively large. It is to be noted that it is also possible for the region 9 which isolates the picture elements to be formed by employing, for example, an n-diffused layer in place of an insulator.

As shown in FIG. 1(B), the solid-state image sensing apparatus is arranged such that normally-ON type SIT $20_{-11}, 20_{-12}, \ldots 20_{-mn}$, each of which has the above-described construction, are arranged in a matrix, and signals are read by the X-Y addressing method. More specifically, the drain of each SIT which constitutes one picture element is grounded, and the respective gate terminals of the SITs disposed along lines which extend in the X-axis direction are connected to respective row lines $21_{-1}, 21_{-2}, \ldots 21_{-m}$. On the other hand, the respective sources of the SITs disposed along lines which extend in the Y-axis direction are connected to respective column lines $22_{-1}, 22_{-2}, \ldots 22_{-n}$, which are commonly connected to a video line 24 through respective transistors $23_{-1}, 23_{-2}, \ldots 23_{-n}$ for column selection. A video voltage $V_S$ is applied to the video line 24 through a load resistor 25.

The row lines $21_{-1}, 21_{-2}, \ldots 21_{-m}$ are connected to a vertical scanning circuit 26 such that signals $\phi_{G1}, \phi_{G2}, \ldots \phi_{Gm}$ are respectively applied to these row lines. On the other hand, the respective gate terminals of the column selecting transistors $23_{-1}, 23_{-2}, \ldots 23_{-n}$ are connected to a horizontal scanning circuit 27 such that signals $\phi_{S1}, \phi_{S2}, \ldots \phi_{Sn}$ are respectively applied to these gate terminals.

The following is a description of the vertical scanning signal $\phi_G$ and the horizontal scanning signal $\phi_S$ on the basis of the waveform chart shown in FIG. 1(C). Each of the signals $\phi_{G1}, \phi_{G2}, \ldots$ includes a voltage $V_{\phi G}$ having a relatively small amplitude and a voltage $V_{\phi R}$ having a larger amplitude than the former and is set such that the signal $\phi_G$ takes the value of $V_{\phi G}$ during a horizontal scanning period $t_H$ for one row line and takes the value of $V_{\phi R}$ during a blanking period $t_{BL}$, that is, a period of time from the completion of horizontal scanning of one row line to the starting of horizontal scanning of the next row line. The horizontal scanning signals $\phi_{S1}, \phi_{S2}, \ldots$ which are applied to the respective gate terminals of the column selecting transistors are signals employed to select the corresponding column lines. The low level of the signals is set at a voltage value at which the column selecting transistors are turned OFF, while the high level of the signals is set at a voltage value at which these transistors are turned ON.

FIG. 2 is a circuit diagram of one picture element for describing the operation of each picture element. The reference numeral 20 denotes a normally-ON type SIT which comprises a grounded drain 1, a gate 4, a capacitor 7 formed between the gate 4 and a gate terminal 8, and a source 3. The gate 4 and the drain 1 of the SIT in combination form a p-n junction diode $D_G$, as shown by the dotted line. The voltage-current characteristic of the diode $D_G$, that is, the relationship between the gate potential $V_G$ and the gate-drain current $I_G$, is such as that shown in FIG. 3(A). When the voltage across the diode $D_G$, that is, $V_G$, exceeds the built-in barrier voltage $\phi_B$ of the p-n junction, a forward current flows. The current $I_D$ flowing between the source and drain of the SIT is determined in accordance with the gate voltage $V_G$. In a typical normally-ON type SIT, $I_D$ is proportional to the exponential function of $V_G$ and hence shows a characteristic curve such as that shown in FIG. 3(B).

Changes in the gate potential which take place when the signal $\phi_G$ is applied through the capacitor 7 to the gate 4 of the SIT shown in FIG. 2 will now be explained with reference to FIG. 4. When the signal $\phi_G$ becomes $V_{\phi R}$ at a time $t_1$, the capacitor 7 is rapidly charged up to a voltage $(V_{\phi R} - \phi_B)$. In consequence, the gate voltage $V_G$ becomes equal to $\phi_B$. Then, when the signal $\phi_G$ becomes 0 V at a time $t_2$, the diode $D_G$ is reverse-biased and, therefore, no current $I_G$ flows. In consequence, the voltage $(V_{\phi R} - \phi_B)$ is maintained across the capacitor 7, and $V_G = -V_{\phi R} + \phi_B$. Thereafter, the charge $Q_L$ is accumulated by irradiation with light until a time $t_3$ at which the signal $\phi_G$ is raised to $V_{\phi G}$, and consequently, $V_G$ rises by $\Delta V_G = Q_L/C_G$ to become equal to $-V_{\phi R} + \phi_B + \Delta V_G$.

When $V_{\phi R}$ at the time $t_3$, the gate voltage $V_G$ rises to equal $-V_{\phi R} + \phi_B + \Delta V_G + V_{\phi G}$. If, at this time, the column selecting transistor 23 is turned ON in response to the signal $\phi_S$, a current $I_{D1}$ such as that shown in FIG. 3(B) flows through the SIT. This current $I_{D1}$ causes a voltage drop $V = I_{D1} \cdot R_L$ is generated on the video line 24. Since current $I_{D1}$ changes with $\Delta V_G$, it is possible for a signal corresponding to the quantity of incident light to be read out.

In FIG. 4, when the signal $\phi_G$ becomes $V_{\phi R}$ again at a time $t_4$, the gate potential $V_G$ becomes $\phi_B$. In consequence, the charge $Q_L$ accumulated so far is cleared. When the signal $\phi_G$ becomes 0 V at a time $t_5$, the gate potential $V_G$ is reset at $V_G = -V_{\phi R} + \phi_B$ again, and the accumulation of charge for the next field is started.

As will be understood from the above description, the value of the voltage $V_{\phi R}$ of the signal $\phi_G$ which has a relatively large amplitude is selected such as to satisfy $V_{\phi G} < V_{\phi R} - \Delta V_G$ from the condition that the gate potential at the time $t_3$, namely, $V_G = -V_{\phi R} + \phi_B + \phi V_G + V_{\phi G}$, is smaller than $\phi_B$, that is, $-V_{\phi R} + \phi_B + \Delta V_G + V_{\phi G} < \phi_B$, so that no gate current flows at the time of row selection.

The operation of the solid-state image sensing apparatus shown in FIG. 1(B) will next be explained on the basis of the operational principle of one picture element described above. When the signal $\phi_{G1}$ becomes $V_{\phi G}$ in response to the operation of the vertical scanning circuit 26, the SITs connected to the row line 21-1 are selected, and as the column selecting transistors 23-1, 23-2, ... 23-n are successively turned ON by the respective signals $\phi_{S1}, \phi_{S2}, \ldots \phi_{Sn}$ which are output from the horizontal scanning circuit 27, optical signals are successively output from the SITs 20-11, 20-12, ... 20-1n through the video line 24. Then, these SITs are reset when the signal $\phi_{G1}$ becomes the high level $V_{\phi R}$.

Then, when the signal $\phi_{G2}$ becomes $V_{\phi G}$, the SITs which are connected to the second row line 21-2 are selected, and optical signals are successively read out from the SITs 20-21, 20-22, ... 20-2n in response to the horizontal scanning signals $\phi_{S1}, \phi_{S2}, \ldots \phi_{Sn}$. Then, these SITs are reset. Thereafter, optical signals are successively read out from the respective picture elements in a similar manner to the above, and a video signal for one field is thereby obtained.

It has been confirmed as the result of experiments that the above-described operation proceeds smoothly. In the arrangement shown in FIG. 1(A), if the distance $l_{GD}$ between each gate region 4 and the drain 1 is large, the gate-drain current becomes correspondingly small owing to the resistance of the epitaxial layer 2, so that the gate potential may be incompletely reset. For this reason, the distance $l_{GD}$ is preferably set at a relatively small value, such as 1 to 3 $\mu$m, from the characteristic point of view. The blanking period $t_{BL}$ is approximately 12 $\mu$s in the case of the NTSC standard television system, and it is possible for the gate potential to be adequately reset within this period under the above-described condition.

The above-described embodiment of the prior art apparatus, which is disclosed in the aforementioned patent application, is effectively applied to a television camera which continuously picks up images. The above-described application for patent discloses another embodiment which may be suitably employed for a so-called electronic camera which picks up images frame by frame.

FIG. 5(A) shows the circuit configuration of the second embodiment of the prior art apparatus, while FIG. 5(B) is a signal waveform chart employed to describe the operation thereof. The fundamental arrangement of this embodiment is the same as that of the embodiment shown in FIG. 1(B). However, the former slightly differs from the latter in that the commonly connected drains 1 of the SITs 20-11, 20-12, ... 20-mn, which constitute respective picture elements, are connected to a reset circuit 40 such that a reset signal $\phi_R$ is applied to the drain 1 of each SIT.

In FIG. 5(B), the reference symbol $\phi_R$ represents a reset signal which is applied to the drain 1 of each SIT. The reset signal $\phi_R$ becomes a negative voltage $(-V_R)$ only during a period when it resets the gate potential of each SIT, and takes 0 V during the other period. The vertical scanning signals $\phi_{G1}, \phi_{G2}, \ldots$ are raised to a high level $V_{\phi G}$ only during a period when the corresponding row lines 21-1, 21-2, ... are scanned, and takes 0 V in the other period. The horizontal scanning signals $\phi_{S1}, \phi_{S2}, \ldots$ effect column selection. The reference symbol SH represents the opening and closing operation of a shutter which is provided on an electronic camera, while the symbol $V_G$ is a chart which shows changes in the gate potential.

The operation of this prior art apparatus will be described hereinunder on the basis of the waveform chart shown in FIG. 5(B). When the reset signal $\phi_R$ becomes a negative voltage $(-V_R)$ at a time $t1$, current flows between the gates and drains of all the SITs, and the gate potential $V_G$ is thereby reset at $-V_R + \phi_B$. Thereafter, the shutter is opened at a time $t_2$ so as to allow irradiation with light.

Thus, the gate potential $V_G$ rises to 31 $V_R + \phi_B + \Delta V_G$. Then, the vertical scanning signal $\phi_{G1}$ becomes a high level $V_{\phi G}$ at a time $t_3$. In consequence, the gate potential $V_G$ of the SITs connected to the row line 21-1 rises to $-V_R + \phi_B + \phi V_G + V_{\phi G}$, and as the columns selecting transistors are turned ON in response to the horizontal scanning signals $\phi_{S1}, \phi_{S2}, \phi_{Sn}$, signals are successively read out from the respective SITs 20-11, 20-12, . . . 20-1n.

Then, at a time t4, the signal $\phi_{G1}$ is changed from $V_{\phi G}$ to 0 V and the signal $\phi_{G2}$ is raised to the high level $V_{\phi G}$, whereby signals are successively read out from the respective SITs 20-21, 20-22, . . . . Thereafter, signals are respectively read out from the SITs 20-31, 20-32, . . . 20-mn in a similar manner to the above, thus obtaining a video signal for one frame. When the reset signal $\phi_R$ becomes a negative voltage ($-V_R$) at a time t5, current flows between the gates and drains of all the SITs. In consequence, all the gate potentials $V_G$ which have been raised by the irradiation with light are reset at $-V_R+\phi_B$, whereby it becomes possible to effect light exposure for the next frame.

FIG. 6(A) shows an arrangement obtained by partially modifying the embodiment of the prior art solid-state image sensing apparatus shown in FIG. 1(B). The circuit for operating each SIT shown in FIG. 1(B) employs the so-called grounded drain arrangement in which the drain is grounded and a positive voltage is applied to the source to read out the output, in a manner similar to that of the second embodiment described above. However, the prior art apparatus shown in FIG. 6(A) employs the so-called source-follower arrangement in which a positive voltage is applied to the drain and the source is grounded through a load resistance.

In this case, since a positive voltage is applied to the drain side, it is necessary in order to reset the gate potential to respectively provide reset transistors 50-1, 50-2, . . . 50-n for the column lines 22-1, 22-2, . . . 22-n to which the respective sources of the SITs are connected for the purpose of grounding these column lines. The reference numeral 51 denotes a reset control circuit which delivers reset pulses to the respective gates of the above-described reset transistors. The respective drains of the picture elements are connected in common on the substrate, and a positive drain voltage $V_D$ is applied to the drains.

Selecting scanning signals $\phi_{G1}, \phi_{G2}, \ldots$ and $\phi_{S1}, \phi_{S2}, \ldots$ which are respectively applied to the row and column lines are similar to those in the prior art apparatus shown in FIG. 1(C) and are shown in FIG. 6(B). The arrangement differs from that shown in FIG. 1(C) only in that, prior to the application of a voltage with an amplitude $V_{\phi R}$ at the time t1 when the row selecting signals $\phi_{G1}, \phi_{G2}, \ldots$ are reset, the reset transistors 50-1, 50-2, . . . 50-n having their drains respectively connected to the column lines 22-1, 22-2, . . . are turned ON in response to the reset pulse $\phi_R$, thus causing the column lines to be grounded. At the reset time t1, all the sources of the SITs on all the column lines which are connected to a selected row line come to the ground potential, and the potential $V_{\phi R}$ is applied to the gates of the SITS. In consequence, a forward current flows to the ground through the column lines and the reset transistors, thus causing the gate potential to be reset. Changes in the gate potential are shown in FIG. 6(C).

In the prior art apparatus shown in FIG. 1(B), the gate potential is reset by means of a forward current which flows from the gate toward the grounded drain of each SIT. On the other hand, in this prior art apparatus the gate potential is reset by means of a forward current which flows from the gate toward the source connected to each of the column lines 22-1, 22-2, . . . which are grounded through the respective reset transistors 50-1, 50-2, . . . . The operation of this prior art apparatus with respect to the other points is completely the same as that of the first-described prior art apparatus.

In this prior art apparatus, if the voltage drop between the drain and source of each of the reset transistors 50-1, 50-2, . . . is large at the time of resetting the gate potential, the time required for the gate potential to be reset is increased correspondingly. It is therefore necessary to minimize the ON resistance of the reset transistors. For this purpose, it is necessary for each reset transistor to possess an adequately large gate width to gate length ratio.

As has been described above, the solid-state image sensing apparatus which has previously been disclosed by the applicant of the present invention has various advantages. However, in this apparatus the output of each picture element includes an offset or dark output as in the case of conventional solid-state image sensing apparatuses employing SITs. It is therefore necessary for these conventional solid-state image sensing apparatuses to cancel the offset or dark output. FIG. 7(A) shows the general circuit configuration of a conventional solid-state image sensing apparatus which employs SITs and is equipped with means for canceling the offset and dark output, while FIG. 7(B) is a signal waveform chart of the apparatus.

Referring to FIG. 7(A), the reference numeral 61 represents a solid-state image sensing apparatus having SIT image sensing elements 62. The apparatus 61 comprises light-shielded picture elements 63 on the first bit line, a vertical scanning circuit 64, column selecting transistors 65, a horizontal scanning circuit 66, a video line 67, a load resistor 68 and a video power supply 69. Since functional members which constitute each of the circuits are similar to those in the above-described embodiments of the prior art apparatus, description thereof is omitted.

The reference numeral 70 denotes a changeover switch which is connected to the video line 67. The switch 70 effects a changeover operation such that the offset or dark output included in the video output $V_1$ shown in FIG. 7(B) is held in a sample-and-hold circuit 71. More specifically, the switch 70 effects a changeover operation in such a manner that the output of each of the light-shielded picture elements on the first bit line is held in the sample-and-hold circuit 71 for a horizontal scanning period $t_H$, and the video output of the second bit line and those of the bit lines subsequent thereto are delivered to a differential amplifier circuit 72. The circuit 72 is fed with the light-shielded picture element output and the video outputs of the second bit line and the lines subsequent thereto and outputs a signal representing the difference therebetween. The video output $V_2$ shown in FIG. 7(B) represents picture element outputs from the differential amplifier circuit 72 which delivers them after canceling any offset and dark output.

The above-described solid-state image sensing apparatus, however, has the following disadvantage. For example, in a state wherein the ambient temperature is relatively high, or in a state wherein the apparatus is provided with a shutter function and wherein the ambience is relatively dark and the time required for integration is consequently increased, the dark output is increased correspondingly, and hence, the dynamic range (the saturation output—the dark output) is undesirably decreased.

SUMMARY OF THE INVENTION

In view of the above-described disadvantage of the conventional solid-state image sensing apparatus, it is a primary object of the present invention to provide a solid-state image sensing apparatus which makes it possible to obtain a video output including no offset nor dark output without decreasing the dynamic range.

To this end, the invention provides a solid-state image sensing apparatus which has: row lines to which row selecting control signals are respectively applied; column lines to which column selecting control signals are respectively applied; a plurality of normally-ON type static induction transistors respectively constituting picture elements, each of the transistors including a first main electrode connected to the corresponding one of the column lines, a second main electrode connected in common to the respective second main electrodes of the other transistors, channel region disposed between these main electrodes, and gate region; a capacitor connected between the gate region of each of the transistors and the corresponding one of the row lines; and means for reverse-biasing the gate region when a signal is read out from each of the picture elements. In this apparatus, some of the picture elements are shielded from light so as to serve as light-shielded picture elements, and an automatic control loop is provided which controls the voltage level of each of the row selecting signals in accordance with the output of the corresponding light-shielded picture element, whereby the voltage level of each row selecting signal is automatically controlled in such a manner that the output of the corresponding light-shielded picture element becomes zero.

By virtue of the above-described arrangement, it is advantageously possible to obtain a video output including no offset nor dark output without decreasing the dynamic range originally possessed by each SIT image sensing element.

The above and other objects, features and advantages of the present invention will become clear from the following description of the preferred embodiments thereof, taken in conjunction with the accompanying drawings.

BRIEF DESCRIPTION OF THE DRAWINGS

FIGS. 1 to 6 in combination show the solid-state image sensing apparatus which has previously been disclosed by the applicant of the present invention, of which:

FIG. 2 is a circuit diagram of one picture element of the prior art apparatus;

FIG. 4 is a signal waveform chart which shows the operation of the circuit shown in FIG. 2;

FIGS. 8 to 16 in combination show the solid-state image sensing apparatus according to the present invention, of which:

FIG. 8 shows the fundamental circuit configuration of the solid-state image sensing apparatus according to the invention;

FIG. 9 shows the general circuit configuration of one embodiment of the apparatus according to the invention;

FIG. 10 is graph which shows the offset which may be involved in the apparatus;

FIG. 11 is a graph which shows the dark output which may be involved in the apparatus;

FIG. 12 is a signal waveform chart which shows the operation of canceling the offset involved in the apparatus;

FIG. 13 is a signal waveform chart which shows the operation of canceling the dark output involved in the apparatus;

FIG. 14 shows the general circuit configuration of another embodiment of the apparatus according to the invention;

FIG. 15 shows the $V_G$-$I_D$ characteristic of the solid-state image sensing apparatus according to the present invention; and FIG. 16 shows the $V_G$-$I_D$ characteristic of the conventional solid-state image sensing apparatus.

DESCRIPTION OF THE PREFERRED EMBODIMENTS

Embodiments of the solid-state image sensing apparatus according to the present invention will be described hereinunder with reference to the accompanying drawings.

Figure 8:
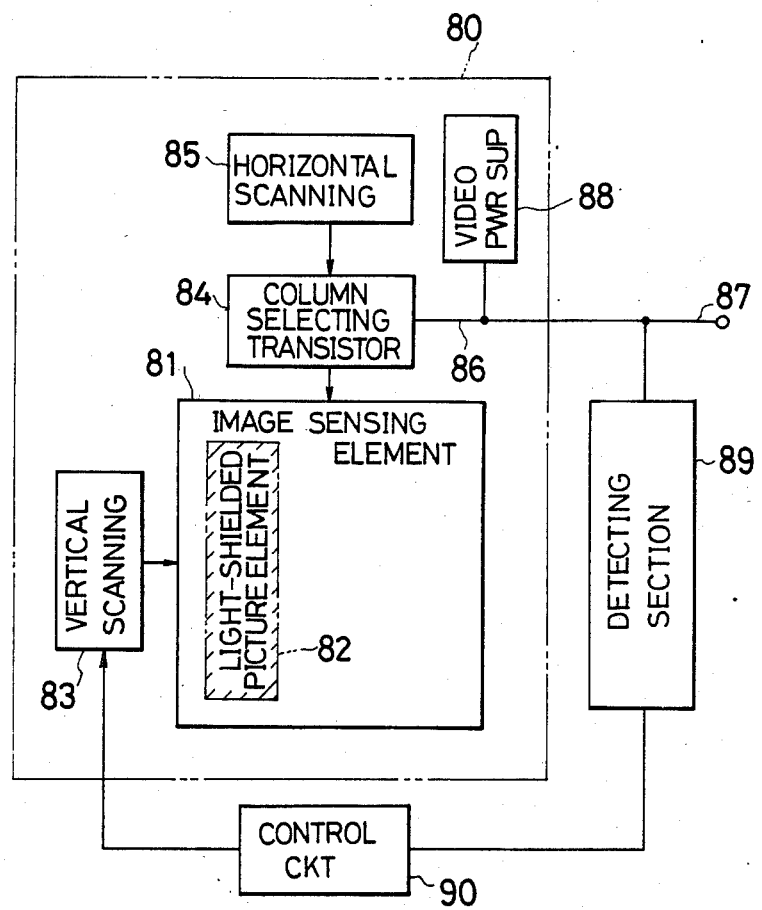

FIG. 8 shows the fundamental circuit configuration of the solid-state image sensing apparatus according to the present invention. The reference numeral 80 represents a solid-state image sensing apparatus having image sensing elements 81 each of which constitutes one picture element. Each element is composed of, for example, the above-described normally-ON type SIT previously disclosed by the applicant of the present invention, and a capacitor. The SIT includes a first main electrode, a second main electrode which is connected in common to the second main electrodes of the other SITs, channel region which is disposed between these main electrodes, and gate region, while the capacitor is provided at the gate region. The picture elements which constitute the image sensing elements 81 are arranged in a matrix: m number for each of the row lines (not shown); and n number for each of the column lines (not shown). Optical signals are respectively read out from the picture elements by the X-Y addressing method. The reference numeral 82 represents light-shielded picture elements obtained by shielding the picture element provided at the first bit position on each of the row lines. It is to be noted that n number of light-shielded picture elements 82 may be disposed on the first row line.

The numeral 83 represents a vertical scanning circuit to which m number of row lines are connected such that signals $\phi_{G1}$, $\phi_{G2}$, ... $\phi_{Gm}$ are respectively applied to these row lines. Column selecting transistors 84 are respectively connected to the corresponding column lines. A horizontal scanning circuit 85 applies signals $\phi_{S1}$, $\phi_{S2}$, ... $\phi_{Sn}$ to respective column selecting transistors. The numeral 86 denotes a video line to which is connected an output terminal 87 and a video power supply 88 to which a load resistor is connected.

To the video line 86 is further connected a detecting section 89 for canceling any offset and dark output which may be included in the picture element output of the apparatus 80. The detecting section 89 is composed of a sample-and-hold circuit or an integrating circuit and a comparator (neither of which is shown). A control circuit 90 is connected to the output side of the detecting section 80 through the comparator, and the vertical scanning circuit 83 is connected to the control circuit 90.

The arrangement is such that the output of each of the light-shielded picture elements 82 is sampled and held by the sample-and-hold circuit or is integrated by the integrating circuit, while the output of the sample-and-hold circuit or the integrating circuit is compared with a preset reference voltage in the comparator, and the supply voltage which is supplied to the vertical scanning circuit 83 is controlled on the basis of the output of the comparator.

It is to be noted that the comparator in the detecting section 89 may be replaced by a differential amplifier which delivers an output which is proportional to the difference between the light-shielded picture element output and the reference voltage. Employment of such a differential amplifier enables a desired automatic control to be readily effected. Employment of a comparator or a differential amplifier in the detecting section is the same as in the case of other embodiments which will be described later.

The following is a description of the fundamental operation of the solid-state image sensing apparatus having the above-described circuit configuration. When the vertical scanning signal $\phi_{G1}$ becomes $V_{\phi G}$ in response to the operation of the vertical scanning circuit 83, the SITs connected to the first row line are selected, and the column selecting transistors 84 are successively turned ON by the respective signals $\phi_{S1}$, $\phi_{S2}$, ... $\phi_{Sn}$ which are output from the horizontal scanning circuit 85. At this time, the output of each of the light-shielded picture elements 82 is supplied to the sample-and-hold circuit or the integrating circuit in the detecting section 89, and the output of either of the circuits is compared with the reference voltage in the comparator, the output of which is then delivered to the control circuit 90. The control circuit 90 supplies the vertical scanning circuit 83 with a control signal which is formed on the basis of the output of the comparator, thereby controlling the supply voltage which is applied to the vertical scanning circuit 83. The supply voltage is automatically controlled until the output signal from the comparator becomes zero.

As described above, the output of the light-shielded picture element is passed through the detecting section 89 which is constituted by the sample-and-hold circuit or the integrating cicuit and the comparator and is then supplied to the control circuit 90 where it is converted into a control signal which controls the supply voltage of the vertical scanning circuit 83. Thus, the detecting section 89, the control circuit 90 and the vertical scanning circuit 83 constitute in combination an automatic control loop which controls the supply voltage of the vertical scanning circuit 83 until the output signal from the comparator in the detecting section 89 becomes zero, thereby allowing cancellation of any offset and dark output which may be included in the picture element output of the solid-state image sensing apparatus 80. The method of canceling the offset and dark output by controlling the supply voltage of the vertical scanning circuit 83 will be described later in more detail.

Figure 9:
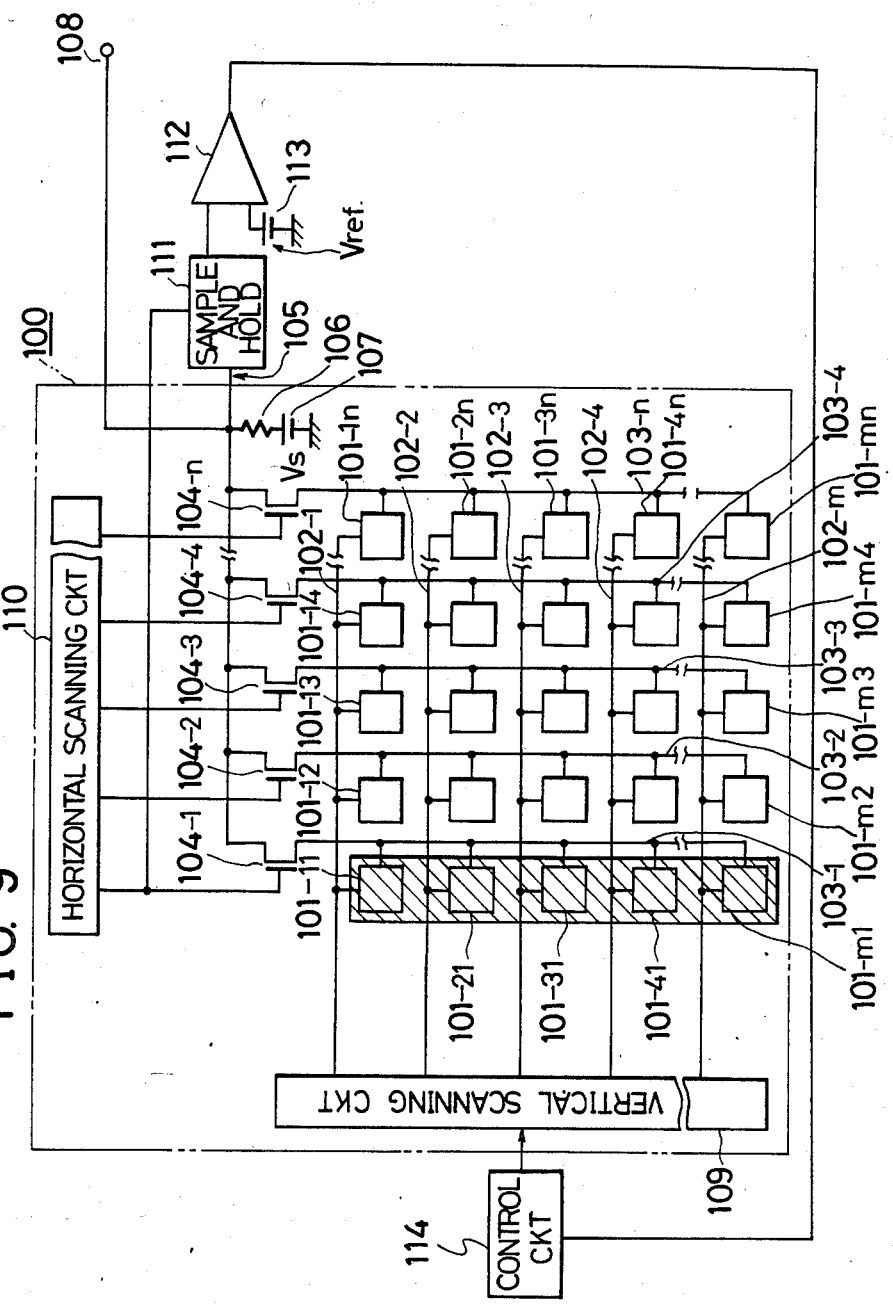
Figure 10:
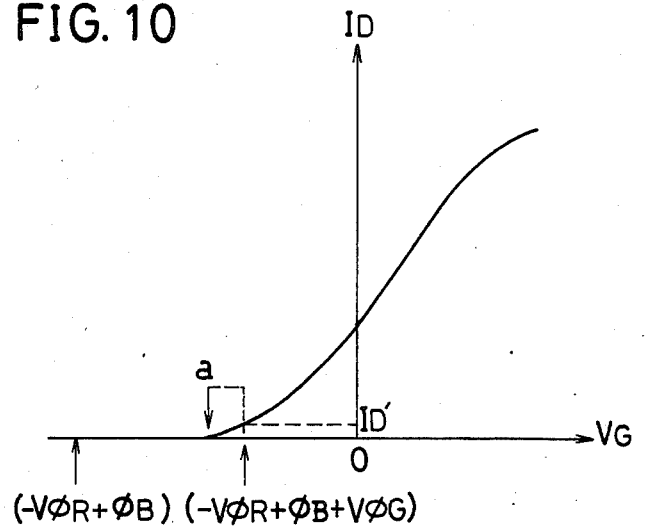
Figure 11:
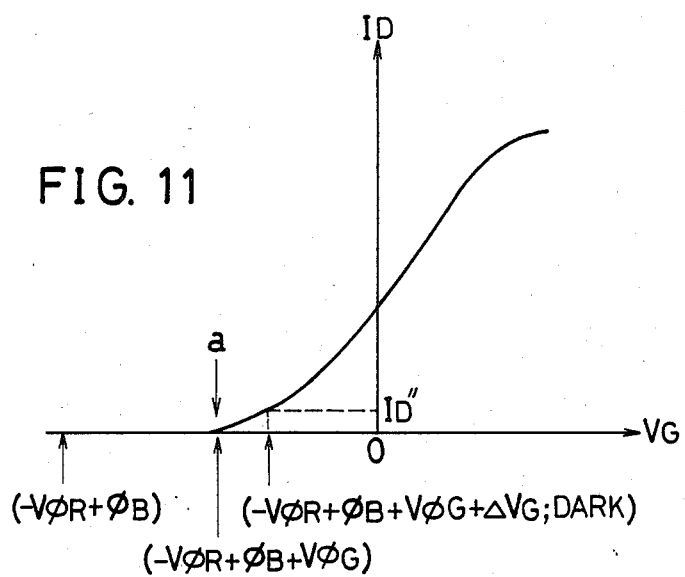

FIG. 9 shows the general circuit configuration of one embodiment of the solid-state image sensing apparatus according to the present invention; FIG. 10 shows the offset which may be included in the picture element output of the solid-state image sensing apparatus; and FIG. 11 shows the dark output which may be included in the picture element output of the solid-state image sensing apparatus.

Referring to FIG. 9, the reference numeral 100 represents a solid-state image sensing apparatus constituted by normally-ON type SITs, for example, the one which has previously been disclosed by the applicant of the present invention. In the apparatus 100, picture elements $101_{-11}$, $101_{-12}$, ... $101_{mn}$ are arranged in a matrix, and signals are read out from the respective picture elements by the X-Y addressing method. More specifically, the drain of each SIT which constitutes one picture element is grounded, and the respective gate terminals of the SITs which are disposed along lines which extend in the X-axis direction are connected to respective row lines $102_{-1}$, $102_{-2}$, ... $102_{-m}$. The first SIT of the SITs disposed on each of the rows, that is, the picture elements $101_{-11}$, $101_{-21}$, ... $101_{-m1}$, are shielded from light so as to serve as light-shielded picture elements, respectively. The respective sources of the SITs disposed along lines which extend in the Y-axis direction are connected to respective column lines $103_{-1}$, $103_{-2}$, ... $103_{-n}$, which are in turn connected in common to a video line 105 through respective column selecting transistors $104_{-1}$, $104_{-2}$, ... $104_{-n}$. A video voltage ($V_S$) 107 is applied to the video line 105 through a load resistor 106. Further, the video line 105 is provided with an output terminal 108.

The row lines $102_{-1}$, $102_{-2}$, ... $102_{-m}$ are connected to a vertical scanning circuit 109 such that signals $\phi_{G1}$, $\phi_{G2}$, ... $\phi_{Gm}$ are respectively applied to these row lines. On the other hand, the respective gate terminals of the column selecting transistor $104_{-1}$, $104_{-2}$, ... $104_{-n}$ are connected to a horizontal scanning circuit 110 such that signals $\phi_{S1}$, $\phi_{S2}$, ... $\phi_{Sn}$ are respectively applied to these gate terminals.

A sample-and-hold circuit 111 is connected to the video line 105 and to the node between the gate terminal of the first-column selecting transistor $104_{-1}$ and the horizontal scanning circuit 110. The sample-and-hold circuit 111 samples and holds a video output signal supplied through the video line 105 and delivers it to one input terminal of a comparator 112. The other input terminal of the comparator 112 is supplied with a preset reference voltage $V_{ref}$ from a reference power supply 113.

A control circuit 114 receives the output signal from the comparator 112 and delivers a control signal for controlling the supply voltage which is supplied to the vertical scanning circuit 109 on the basis of the output signal of the comparator 112. It is to be noted that the level control of the supply voltage will be described later.

The operation of the solid-state image sensing apparatus 100 shown in FIG. 9 will now be described. In this apparatus, when the signal $\phi_{G1}$ is raised to $V_{\phi G}$ by the operation of the vertical scanning circuit 109, the SITs which are connected to the first row line $102_{-1}$ are selected. Then, the column selecting transistors $104_{-1}$, $104_{-2}$, . . . $104_{-n}$ are successively turned ON by the respective signals $\phi_{S1}$, $\phi_{S2}$, . . . $\phi_{Sn}$ which are output from the horizontal scanning circuit 110. In response to this operation, optical signals are successively output from the respective picture elements $101_{-11}$, $101_{-12}$, . . . $101_{-1n}$ through the video line 105. In this case, the output of the first light-shielded picture element $101_{-11}$ is first sampled and held by the circuit 111. More specifically, when the signal $\phi_{S1}$ causes the column selecting transistor $104_{-1}$ to turn ON, the signal $\phi_{S1}$ is simultaneously supplied also to the sample-and-hold circuit 111. In consequence, the gate in the circuit 111 is opened for a period of time when the signal $\phi_{S1}$ is being applied thereto. Accordingly, when this gate is open, the output of the light-shielded picture element $101_{-11}$ is input to the sample-and-hold circuit 111, and the output of the circuit 111 is input to the comparator 112 where it is compared with the reference voltage $V_{ref}$. The output signal from the comparator 112 is fed back to the control circuit 114, and the control signal from the control circuit 114 controls the supply voltage of the vertical scanning circuit 109 in such a manner that the output signal from the comparator 112 becomes zero.

When the output signal from the comparator 112 becomes zero as the result of the above-described control of the supply voltage, the offset and dark output of the solid-state image sensing apparatus 100 are canceled. Thereafter, optical signals are successively output to the video line 105 from the picture elements $101_{-12}$, $101_{-13}$, . . . $101_{-1n}$ which are subsequent to the first light-shielded picture element $101_{-11}$. Then, these picture elements are reset when the signal $\phi_{G1}$ is raised to a high level $V_{\phi R}$.

Thus, when reading out picture element signals from the SITs connected to the first row line $102_{-1}$, the control circuit 114 controls the supply voltage of the vertical scanning circuit 109 on the basis of the output of the light-shielded picture element $101_{-11}$, and the control circuit 114 continuously effects this control, which has been carried out on the first row line, with respect to the light-shielded picture elements $101_{-21}$, $101_{-31}$, . . . $101_{-m1}$ which are respectively connected to the row lines $102_{-2}$, $102_{-3}$, . . . $102_{-m}$ subsequent to the first row line $102_{-1}$. In other words, when it is possible to ignore characteristic variations of the SITs which respectively constitute the picture elements $101_{-11}$, $101_{-12}$, . . . $101_{-mn}$, the control circuit 114 is allowed to omit the control operation for each of the light-shielded picture elements $101_{-21}$, $101_{-31}$, . . . $101_{-m1}$ which are respectively connected to the row lines subsequent to the first row line.

Returning to the subject, when picture element signals have been read out from all the SITs connected to the first row line, the signal $\phi_{G2}$ becomes $V_{\phi G}$. In consequence, the picture elements connected to the second row line $102_{-2}$ are selected, and optical signals are successively read out from the picture elements $101_{-21}$, $101_{-22}$, . . . $101_{-2n}$ in response to the respective horizontal scanning signals $\phi_{S1}$, $\phi_{S2}$, . . . $\phi_{Sn}$. These picture elements are then reset. Thereafter, in a manner similar to the above, optical signals are successively read out from the picture elements connected to each of the remaining row lines, and a video signal for one field is thereby obtained.

It is to be noted that although this embodiment exemplifies an arrangement in which the offset and dark output of the solid-state image sensing apparatus 100 are canceled by means of the output of the light-shielded picture element on the first row line, it is also possible to effect control for each of the row lines by employing the output of each of the light-shielded picture elements $101_{-11}$, $101_{-21}$, . . . $101_{-m1}$ and supplying the vertical scanning circuit 109 with a control signal for each of the corresponding row lines $102_{-1}$, $102_{-2}$, $102_{-3}$, . . . $102_{-m}$ from the control circuit 114.

The following is a description of means for canceling the offset and dark output on the basis of the control signal. Description will first be made with respect to the cancellation of the offset which may be included in the picture element output of the solid-state image sensing apparatus 100. In this description, FIGS. 1 to 4 will be employed again.

Figure 1A:
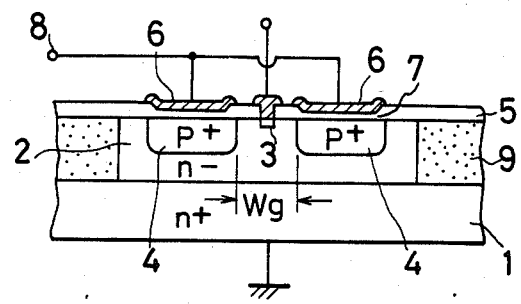
FIG. 1(A) is a sectional view of an SIT which constitutes one picture element of one embodiment of the prior art apparatus.
Figure 1B:
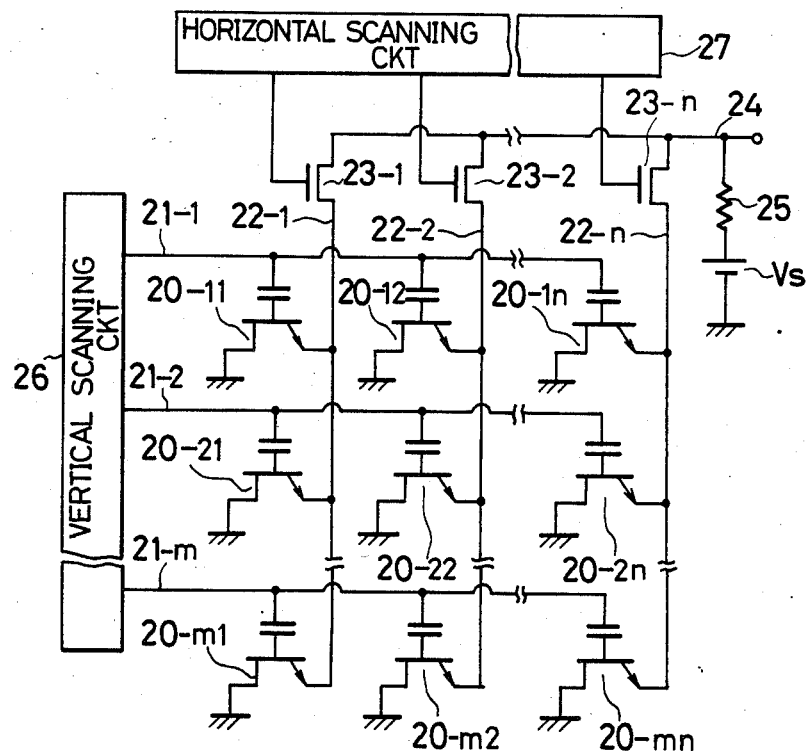
FIG. 1(B) shows the general circuit configuration of the embodiment of the prior art apparatus.
Figure 1C:
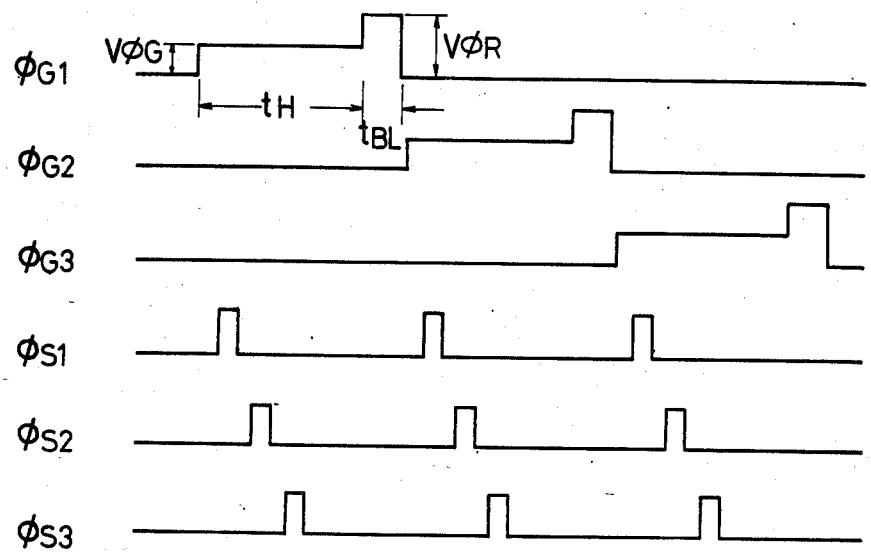
FIG. 1(C) is a signal waveform chart which shows the operation of the embodiment.
Figure 2:
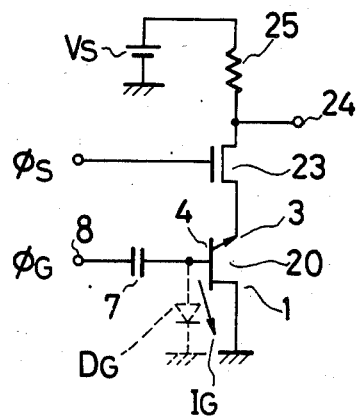

Assuming now that the reference symbol $I_D'$ shown in FIG. 10 represents the drain current flowing through one light-shielded picture element when a vertical scanning signal $\phi_G$ such as that shown in FIG. 1(C) is applied, this drain current $I_D'$ corresponds to the offset included in the picture element output. Such an offset is caused by inappropriate setting of the voltages $V_{\phi R}$ and $V_{\phi G}$ for the vertical scanning signal $\phi_G$. More specifically, as shown in FIG. 2, the gate 4 and drain 1 of each SIT in combination constitute a p-n junction diode $D_G$, and the voltage-current characteristic of the diode $D_G$ is such that, when the voltage across the diode $D_G$, that is, $V_G$, exceeds the built-in barrier voltage $\phi_B$ of the p-n junction, a forward current flows (see FIG. 3). The current $I_D$ flowing between the source and drain of the SIT is determined by the gate voltage $V_G$. It has been already stated that the drain current $I_D$ is proportional to the exponential function of the gate voltage $V_G$ in a typical normally-ON type SIT.

Figure 4:
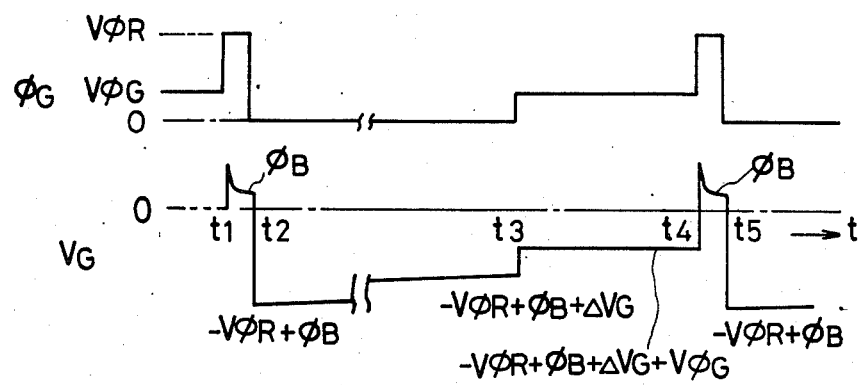

Changes in the gate potential caused when the signal $\phi_G$ is applied to the gate 4 of the SIT shown in FIG. 2 through the capacitor 7 are such as those which have already been explained with reference to FIG. 4. When the signal $\phi_G$ becomes $V_{\phi R}$ at the time $t_1$, a forward current flows through the diode $D_G$ via the capacitor 7, thus causing it to be rapidly charged up to a voltage $(V_{\phi R} - \phi_B)$. In consequence, the gate voltage $V_G$ becomes $\phi_B$. Then, when the signal $\phi_G$ becomes 0 V at the time $t_2$, the diode $D_G$ is reverse-biased and, hence, no current $I_G$ flows. Therefore, the voltage $(V_{\phi R} - \phi_B)$ is maintained across the capacitor 7, and the gate voltage $V_G$ becomes equal to $-V_{\phi R} + \phi_B$. Thereafter, the charge $Q_L$ is accumulated by the irradiation with light until the time $t_3$ when the voltage $V_{\phi G}$ of the signal $\phi_G$ is applied. Thus, the gate voltage $V_G$ rises by $\Delta V_G = Q_L/C_G$ to become equal to $-V_{\phi R} + \phi_B + \Delta V_G$. When the voltage $V_{\phi G}$ is applied at the time $t_3$, the gate voltage $V_G$ is further raised to equal $-V_{\phi R} + \phi_B + \Delta V_G + V_{\phi G}$.

Figure 3A:
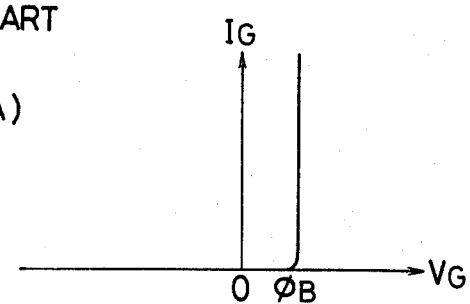
FIGS. 3(A) and 3(B) respectively show $V_G$-$I_G$ and $V_G$-$I_D$ characteristics of an SIT which constitutes one picture element of the prior art apparatus.
Figure 3B:
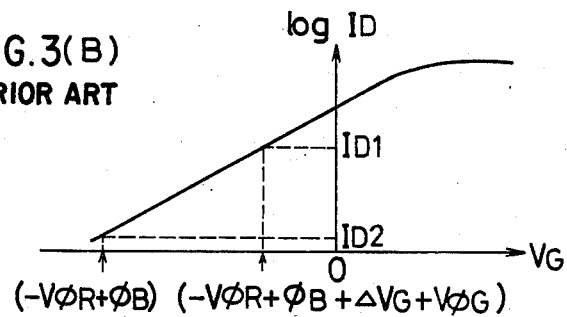

When, under this state, the column selecting transistor 23 is turned ON in response to the signal $\phi_S$, a current $I_{D1}$ such as that shown in FIG. 3(B) flows through the SIT. The current $I_{D1}$ causes a voltage drop $V = I_{D1} \cdot R_L$ across the load resistor (its load resistance is represented by $R_L$) 25, thus generating a signal output $V_{out}=V_S-I_{D1}\cdot R_L$ on the video line 24 (see FIG. 2). Since the current $I_{D1}$ changes with $\Delta V_G$, it is possible to read out a signal corresponding to the quantity of incident light. As shown in in FIG. 4, when the signal $\phi_G$ becomes $V_{\phi R}$ again at the time $t_4$, the gate potential $V_G$ becomes $\phi_B$, and the charge $Q_L$ accumulated so far is cleared. When the signal $\phi_G$ becomes 0 V at the time $t_5$, the gate potential $V_G$ is reset such as to equal $-V_{\phi R}+\phi_B$ again, and accumulation of charges for the next field is started.

As will be understood from the above description, the voltage $V_{\phi R}$ of the vertical scanning signal $\phi_G$ which has a relatively large amplitude is selected to take such a value that the drain current $I_{D2}$ of the SIT which corresponds to the gate voltage $V_G=-V_{\phi R}+\phi_B$ is sufficiently small that the SIT turns OFF. On the other hand, the voltage $V_{\phi G}$ of the signal $\phi_G$ which has a relatively small amplitude is selected such as to take a value which satisfies $V_{\phi G}<V_{\phi R}-\Delta V_G$ from the condition that the gate potential at the time $t_3$, that is, $V_G=-V_{\phi R}+\phi_B+\Delta V_G+V_{\phi G}$ is smaller than $\phi_B$, that is, $-V_{\phi R}+\phi_B+\Delta V_G+V_{\phi G}<\phi_B$, so that no gate current flows at the time of row selection.

Accordingly, there is no fear of any offset being produced, as clearly shown by the point a in FIG. 10, by adjusting and properly setting the voltages $V_{\phi R}$ and $V_{\phi G}$ such that the drain current $I_D$ at the time when the gate voltage $V_G$ equals $-V_{\phi R}+\phi_B+V_{\phi G}$ is zero.

The following is a description of means for canceling a dark output which may be included in the picture element output of the solid-state image sensing apparatus 100. Referring to FIG. 11, it is assumed that the voltages $V_{\phi R}$ and $V_{\phi G}$ are properly set as described above and the picture element output therefore includes no offset. When the gate voltage $V_G$ of the light-shielded picture element is raised to a voltage $\{-V_{\phi R}+\phi_B+V_{\phi G}+\Delta V_G;$ DARK$\}$ by thermally excited holes, a drain current $I_D''$ corresponding to this gate voltage flows, this current corresponding to the dark output. To cancel this dark output, it is only necessary to adjust the voltages $V_{\phi R}$ and $V_{\phi G}$ in such a manner that the drain current $I_D$ corresponding to the gate voltage $V_G=\{-V_{\phi R}+\phi_B+V_{\phi G}+\Delta V_G;$ DARK$\}$ becomes zero (see the point a in FIG. 11).

As will be clear from the above description, to cancel an offset or a dark output, it suffices to automatically control the voltages $V_{\phi R}$ and $V_{\phi G}$ of the vertical scanning signal $\phi_G$ in accordance with the output of each of the light-shielded picture elements.

Figure 12:
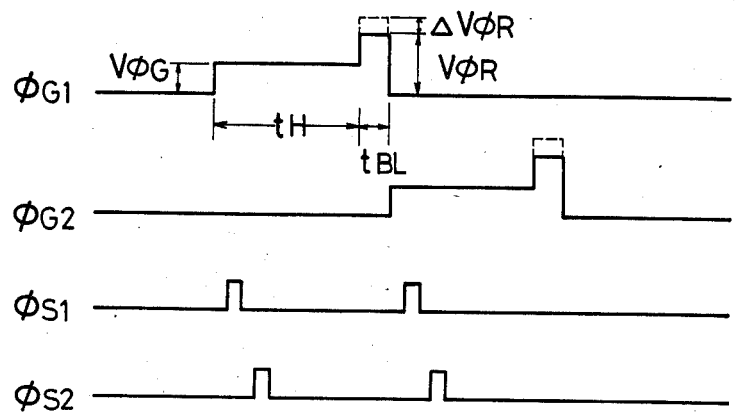

FIG. 12 is a signal waveform chart which shows the operation of controlling the voltage $V_{\phi R}$ in the embodiment shown in FIG. 9. As will be understood from the Figure, it is only necessary to control the voltage $V_{\phi R}$ such as to be $V_{\phi R}'=V_{\phi R}+\Delta V_{\phi R}$ in accordance with the output of each of the light-shielded picture elements of the solid-state image sensing apparatus 100.

Figure 13:
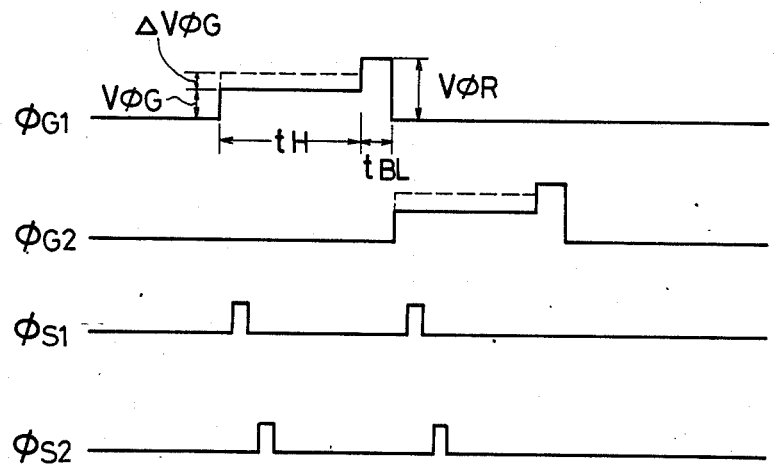

FIG. 13 is a signal waveform chart which shows the operation of controlling the voltage $V_{\phi G}$ in this embodiment. It will be clear from the Figure that it suffices to control the voltage $V_{\phi G}$ such as to be $V_{\phi G}'=V_{\phi G}+\Delta V_{\phi G}$ in accordance with the output of each of the light-shielded picture elements of the solid-state image sensing apparatus 100.

Figure 14:
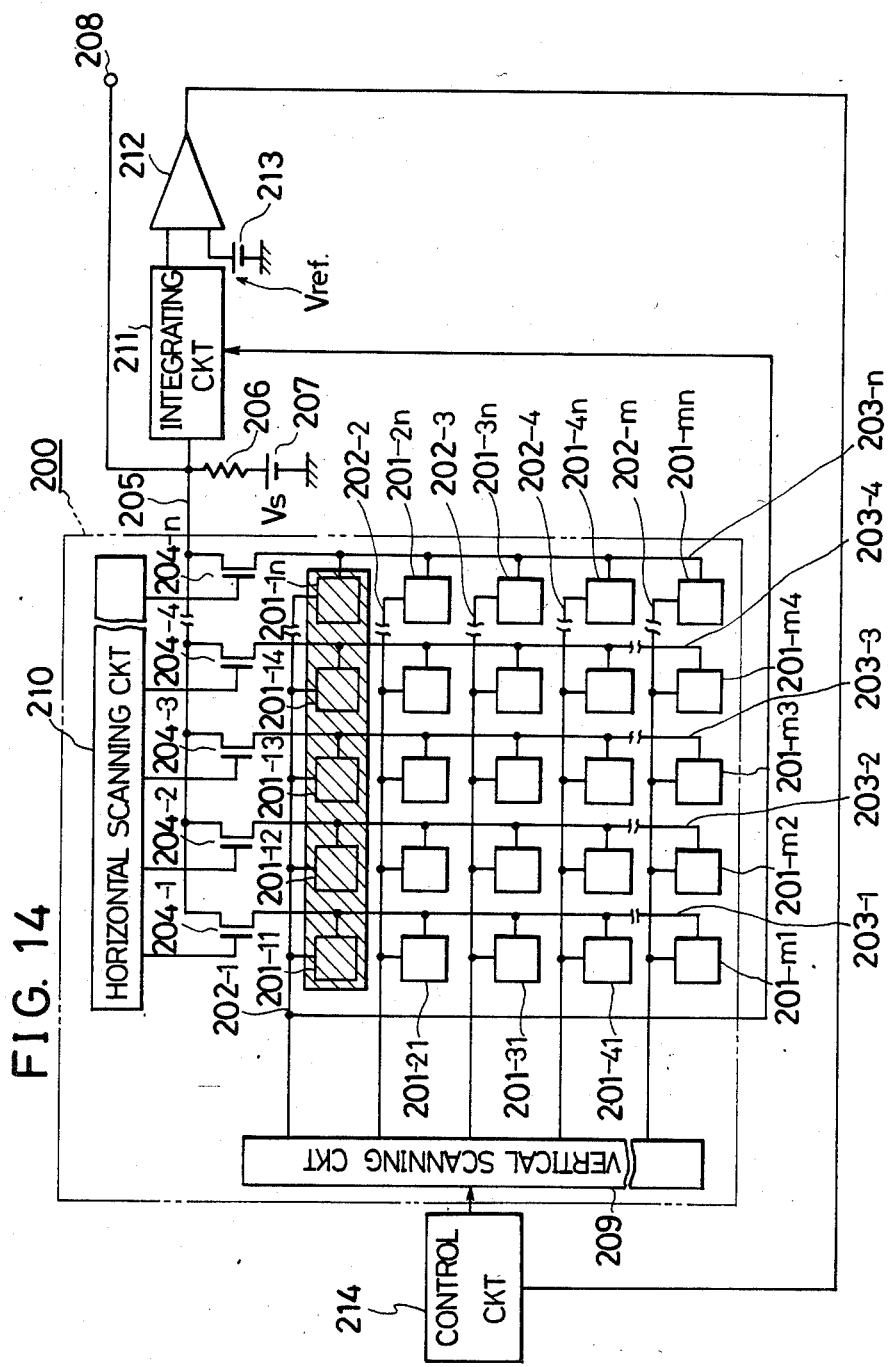

FIG. 14 shows the general circuit configuration of another embodiment of the solid-state image sensing apparatus according to the present invention.

Referring to FIG. 14, the reference numeral 200 denotes a solid-state image sensing apparatus constituted by normally-ON type SITs, for example, the one which has previously been disclosed by the applicant of the present invention and described hereinbefore. In the apparatus 200, picture elements $201_{-11}$, $201_{-12}$, ... $201_{mn}$ are arranged in a matrix, and signals are read out from these picture elements by the X-Y addressing method. More specifically, each picture element is constituted by one SIT which has its drain grounded. The gate terminals of the SITs disposed along lines which extend in the X-axis direction are respectively connected to row lines $202_{-1}$, $202_{-2}$, ... $202_{-m}$. Among the picture elements, those which are connected to the first row line, that is, the picture elements $201_{-11}$, $201_{-12}$, ... $201_{-1n}$, are shielded from light, thus respectively constituting light-shielded picture elements. The sources of the SITs disposed along lines which extend in the Y-axis direction are respectively connected to column lines $203_{-1}$, $203_{-2}$, ... $203_{-n}$, which are connected in common to a video line 205 through respective column selecting transistors $204_{-1}$, $204_{-2}$, ... $204_{-n}$. A video voltage ($V_S$) 207 is applied to the video line 205 through a load resistor 206. Further, the video line 205 is provided with an output terminal 208.

The row lines $202_{-1}$, $202_{-2}$, ... $202_{-m}$ are connected to a vertical scanning circuit 209 in such a manner that signals $\phi_{G1}$, $\phi_{G2}$, ... $\phi_{Gm}$ are respectively applied to these lines. On the other hand, the respective gate terminals of the column selecting transistors $204_{-1}$, $204_{-2}$, ... $204_{-n}$ are connected to a horizontal scanning circuit 210 in such a manner that signals $\phi_{S1}$, $\phi_{S2}$, ... $\phi_{Sn}$ are respectively applied to these gate terminals.

An integrating circuit 211 is connected to the video line 205 and the first row line $202_{-1}$. The integrating circuit 211 integrates a video output signal supplied thereto through the video line 205 and delivers its output to one of the input terminals of a comparator 212. To the other input terminal of the comparator 212 is input a preset reference voltage $V_{ref}$ from a reference power supply 213. A control circuit 214 receives the output signal from the comparator 212 and delivers a control signal which controls the supply voltage which is supplied to the vertical scanning circuit 209 on the basis of the output signal from the comparator 212.

The following is a description of the operation of the solid-state image sensing apparatus 200 shown in FIG. 14.

When the signal $\phi_{G1}$ is raised to $V_{\phi G}$ by the operation of the vertical scanning circuit 209, the SITs connected to the first row line $202_{-1}$ are selected, and the integrating circuit 211 is actuated. Then, the column selecting transistors $204_{-1}$, $204_{-2}$, ... $204_{-n}$ are successively turned ON in response to the respective signals $\phi_{S1}$, $\phi_{S2}$, ... $\phi_{Sn}$ which are output from the horizontal scanning circuit 210. At this time, signals are successively output from the respective picture elements $201_{-11}$, $201_{-12}$, ... $201_{-1n}$ through the video line 205. In this case, the output of the first light-shielded picture element $201_{-11}$ is first fed to the integrating circuit 211.

This light-shielded picture element output is integrated in the integrating circuit 211 and is then compared with the reference voltage $V_{ref}$ by the comparator 212. The output signal from the comparator 212 is fed back to the control circuit 214, and the control signal from the control circuit 214 control the supply voltage of the vertical scanning circuit 209 in such a manner that the output signal of the comparator 212 becomes zero. When the output signal of the comparator 212 becomes zero by the above-described control, the offset and the dark output which are included in the light-shielded picture element output of the solid-state image sensing apparatus 200 are canceled. Thereafter, optical signals are successively output from the respective picture elements $201_{-12}, 201_{-13}, \ldots 201_{-1n}$ through the video line 205. These picture elements are reset when the signal $\phi_{G1}$ is raised to the high level $V_{\phi R}$.

In the above-described operation, the control circuit 214 controls the supply voltage of the vertical scanning circuit 209 on the basis of the output of the light-shielded picture element $201_{-11}$, and the control circuit 214 continuously carries out the control, which has been effected on the basis of the output of the first light-shielded picture element $201_{-11}$, with respect to the light-shielded picture elements $201_{-12}, 201_{-13}, \ldots 201_{-1n}$ which are respectively connected to the subsequent column lines $203_{-2}, 203_{-3}, \ldots 203_{-n}$. In other words, the arrangement is such that, when it is possible to ignore characteristic variations among the SITs which respectively constitute the picture elements $201_{-11}, 201_{-12}, \ldots 201_{mn}$, the control circuit 214 is allowed to omit the control operation for each of the light-shielded picture elements $201_{-11}, 201_{-12}, \ldots 201_{-1n}$.

Returning to the subject, when the signal $\phi_{G2}$ becomes $V_{\phi G}$, the picture elements connected to the second row line $202_{-2}$ are selected, and optical signals are successively read out from the respective picture elements $201_{-21}, 201_{-22}, \ldots 201_{-2n}$ in response to the respective horizontal scanning signals $\phi_{S1}, \phi_{S2}, \ldots \phi_{Sn}$. Then, these picture elements are reset. Thereafter, optical signal are successively read out from the respective picture elements in a manner similar to the above, thus obtaining a video signal for one field. It is to be noted that although this embodiment exemplifies the arrangement in which the offset and dark output in relation to the solid-state image sensing apparatus 200 are canceled by means of the output of the first light-shielded picture element, it is also possible to control the voltages $V_{\phi G}$ and $V_{\phi R}$ of the vertical scanning signal $\phi_G$ by employing the output of each of the light-shielded picture elements $201_{-11}, 201_{-12}, \ldots 201_{-1n}$ and supplying the vertical scanning circuit 209 with a control signal for each of the corresponding column lines $203_{-1}, 203_{-2}, \ldots 203_{-n}$ from the control circuit 214.

When the solid-state image sensing apparatus 200 in accordance with this embodiment involves an offset and a dark output, it is possible to cancel them by controlling either one of the voltages $V_{\phi R}$ and $V_{\phi G}$ of the vertical scanning signal $\phi_G$ in a manner similar to the above.

Advantages which are offered by the method of canceling the offset and the dark output in the solid-state image sensing apparatus according to the present invention will next be explained with reference to FIGS. 15 and 16 which are characteristic charts showing the relationship between the drain current $I_D$ and the gate voltage $V_G$. The saturation level of the solid-state image sensing apparatus employing SITs is determined at the point at which the gate voltage $V_G$ equals the built-in barrier voltage $\phi_B$ between the gate 4 (p+) and the drain 1 (n+) (see the point b in FIG. 15).

Figure 7A:
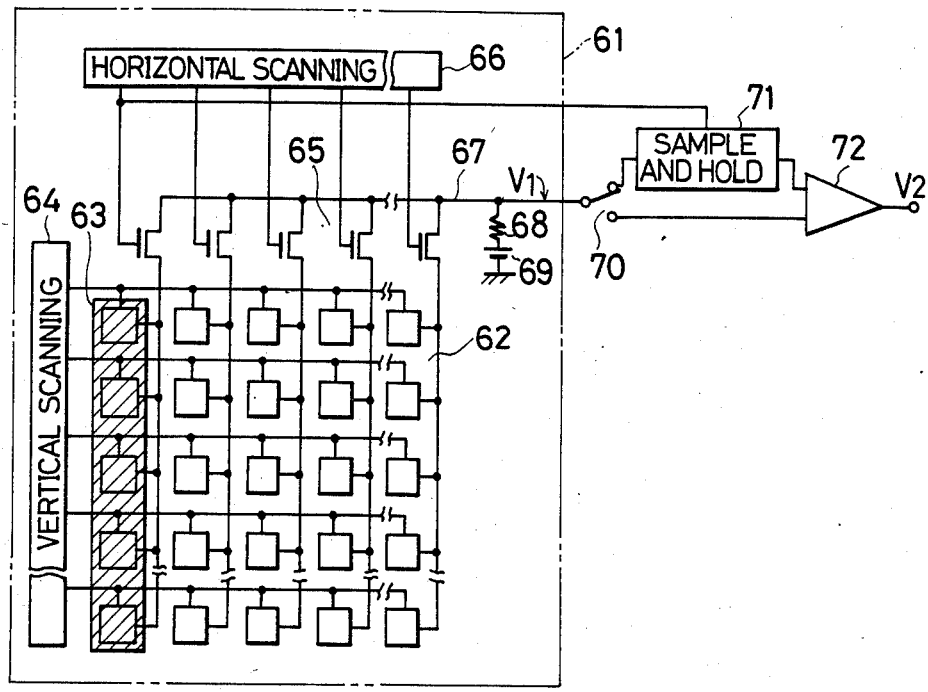
FIG. 7(A) shows the general circuit configuration of another conventional SIT solid-state image sensing apparatus.
Figure 7B:
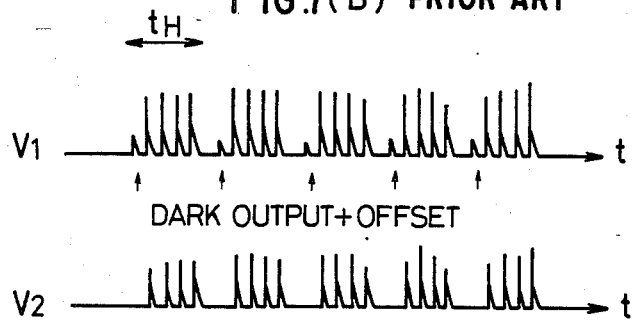
FIG. 7(B) is a signal waveform chart which illustrates the operation of the conventional apparatus shown in FIG. 7(A).
Figure 15:
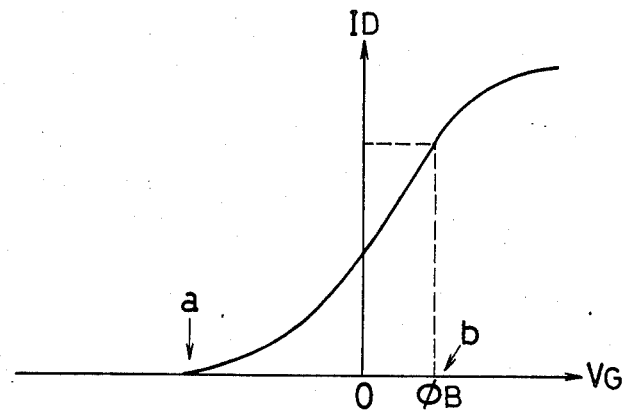
Figure 16:
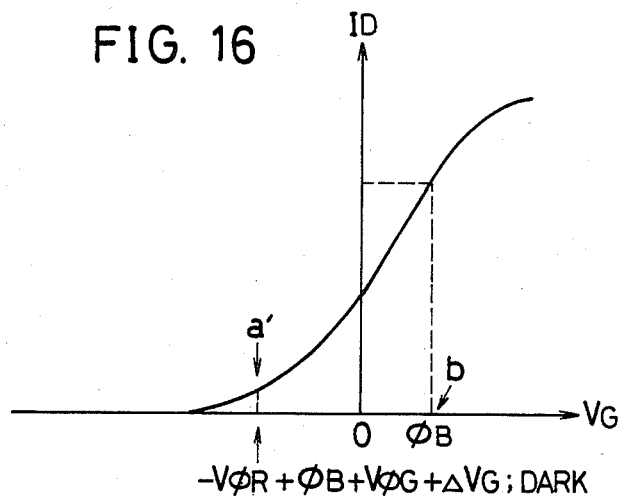

Accordingly, the offset and dark output canceling method according to the present invention advantageously makes it possible to widen the range of changes in the gate voltage with respect to the incident light quantity, that is, from the point a to the point b in FIG. 15. In contrast to this, the conventional solid-state image sensing apparatus 61 shown in FIG. 7 has an unfavorably narrow range, that is, from the point a' to the point b shown in FIG. 16.

As will be clear from the above description, the present invention advantageously makes it possible to cancel the offset and the dark output without decreasing the dynamic range, whereas the conventional solid-state image sensing apparatus involves an undesirable reduction in the dynamic range.

Figure 5A:
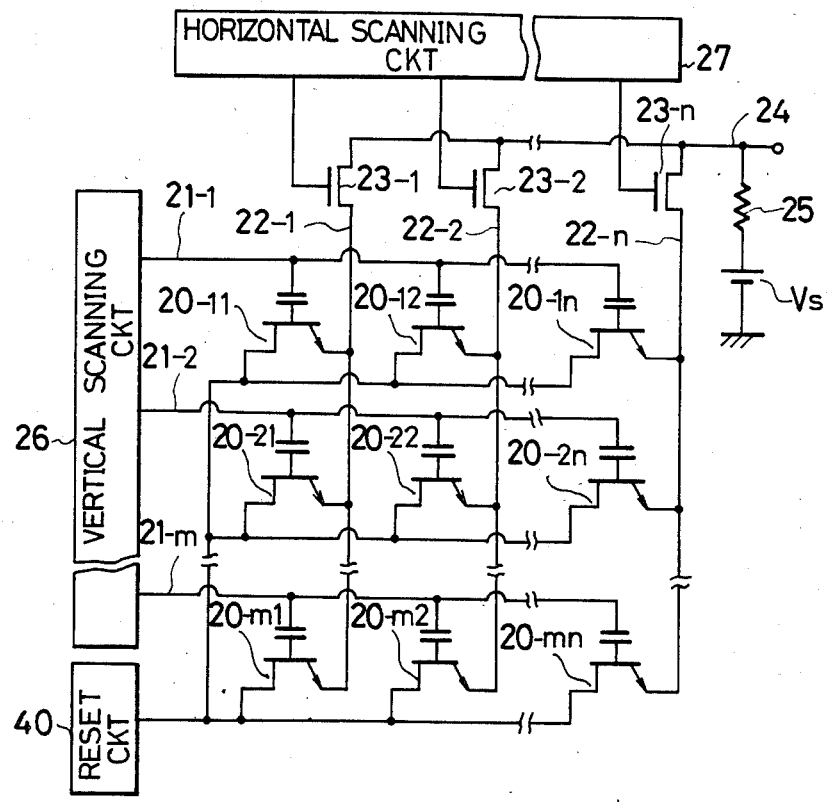
FIG. 5(A) shows the general circuit configuration of another embodiment of the prior art apparatus.
Figure 5B:
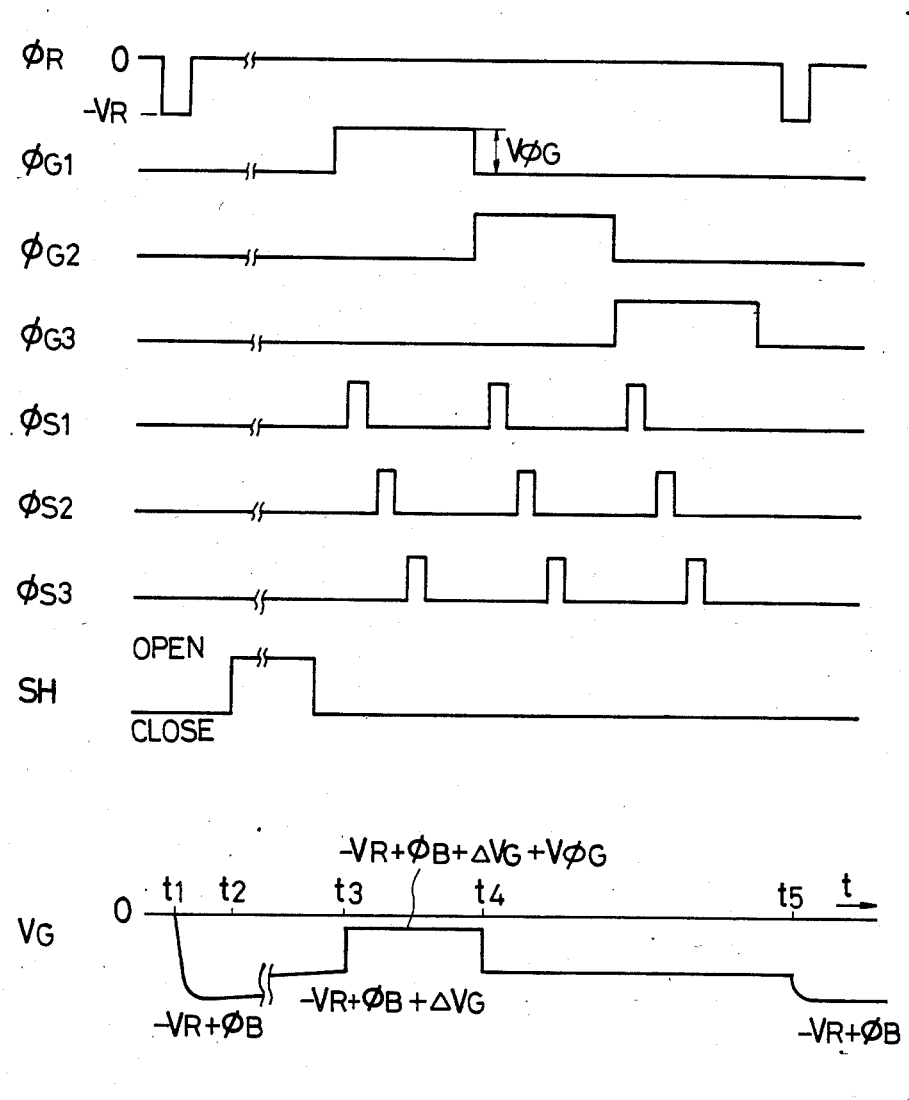
FIG. 5(B) is a signal waveform chart which shows the operation of the embodiment shown in FIG. 5(A)
Figure 6A:
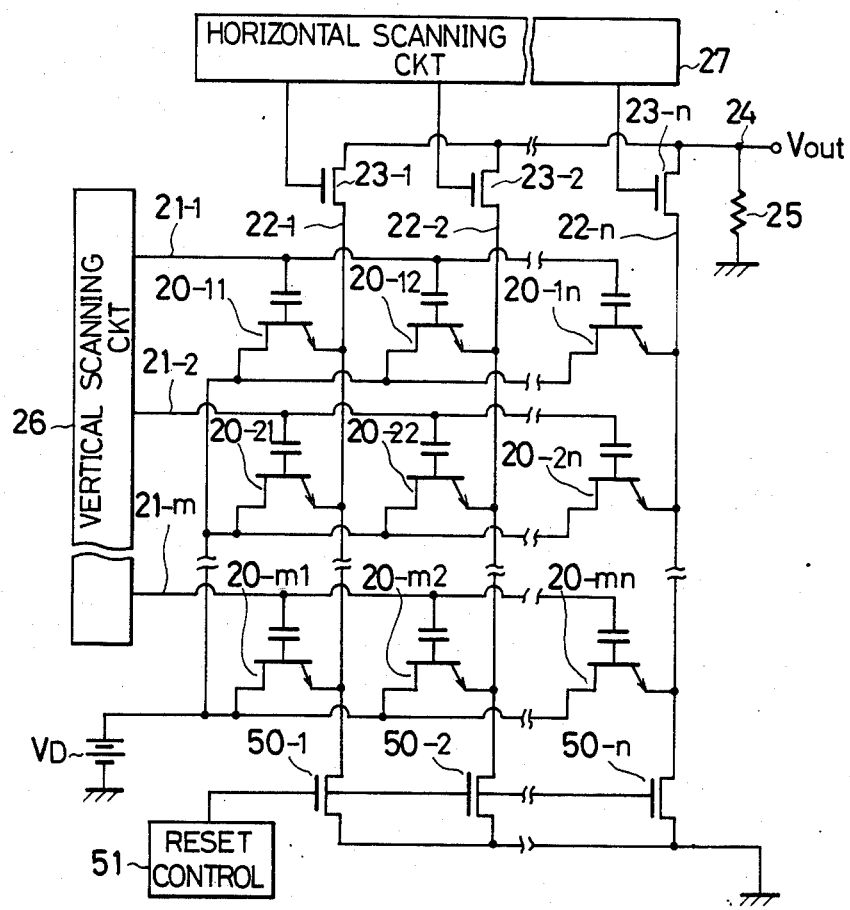
FIG. 6(A) shows the general circuit configuration of still another embodiment of the prior art apparatus.
Figure 6B:
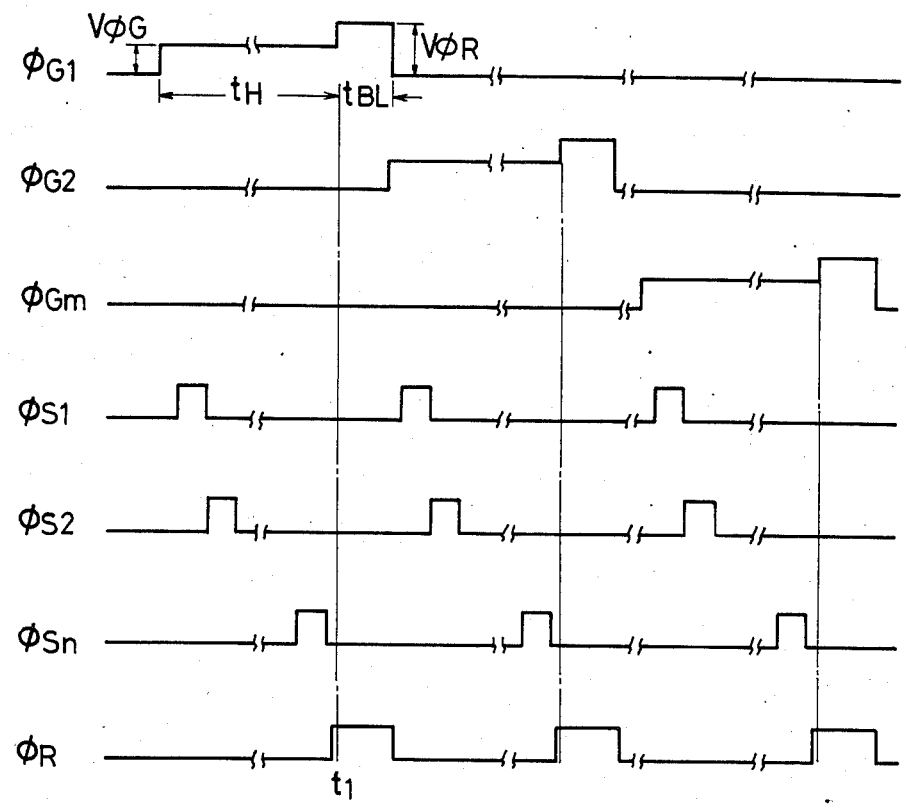
FIG. 6(B) is a signal waveform chart which shows the operation of the embodiment shown in FIG. 6(A)
Figure 6C:
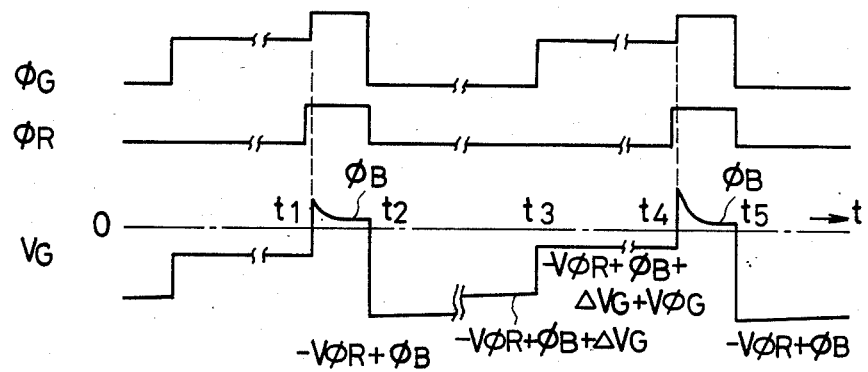
FIG. 6(C) shows changes in the gate potential in the embodiment shown in FIG. 6(A).

If the present invention is applied to a solid-state image sensing apparatus additionally provided with a shutter function, for example, the one (see FIGS. 5 and 6) which has previously been disclosed by the applicant of the present invention, it is conveniently possible to obtain an excellent picture even in the case where the background of the optical image is relatively dark and hence the time required for integration is relatively long. Such effective functions and operations for this type of solid-state image sensing apparatus cannot be realized by conventional solid-state image sensing apparatuses which employ charge-transfer elements such as CCDs and BBDs, MOS transistors or the like.

The present invention is not necessarily limited to the above-described embodiments, and various changes and modifications may be imparted thereto. Although in the embodiments the cancellation of the offset or the dark output is effected by the automatic control loop in such a manner that the voltages $V_{\phi R}$ and $V_{\phi G}$ are individually controlled, it is possible for this automatic control loop to control the voltages $V_{\phi R}$ and $V_{\phi G}$ at the same time.

Further, the above-described embodiments exemplify the arrangement in which the source of each normally-ON type SIT, which is one of the main electrodes thereof, is connected to the corresponding column line, and the drain thereof, serving as the other main electrode, is grounded in common with the drains of the other SITs. However, the way in which the above-described main electrodes are connected may be reversed. Furthermore, it is possible to fabricate into a one-chip semiconductor the above-described principal functional members and circuits which constitute the solid-state image sensing apparatus of the invention, e.g., the SIT image sensing elements, the column selecting switches, the vertical and horizontal scanning circuits, the load resistor of the video power supply, the sample-and-hold circuit or integrating circuit, the comparator and the control circuit, by properly selecting them according to need.

Moreover, the invention is not necessarily limited to the above-described solid-state image sensing apparatus employing normally-ON type SITs which are arranged in a matrix. Namely, the invention may be applied to a so-called line image sensor in which normally-ON type SITs are arranged in a single line or a plurality of lines. In such a case, the arrangement may be such that one picture element which constitutes the first bit is shielded from light so as to serve a light-shielded picture element, and the output of the light-shielded picture element is input to the automatic control loop according to the present invention to effect control in such a manner that the output signal from the comparator becomes zero.

What is claimed is:
1. A solid-state image sensing apparatus comprising:
a plurality of row lines;

means for applying row selecting control signals to said row lines;
a plurality of column lines;
means for applying column selecting control signals to said column lines;
a plurality of picture elements, including at least one light-shielded picture element, each of said picture elements comprising normally-on type static induction transistors, each of said static induction transistors comprising a first layer of a substrate forming a first main electrode, a second layer of a channel disposed on said substrate, a source formed on the surface of the second layer forming a second main electrode and a gate formed within the second layer adjacent said channel, an insulator disposed on said gate, gate electrodes disposed on said insulator forming a capacitor therebetween, said second main electrode connected to a corresponding one of said column lines, said first main electrode connected commonly to respective first electrodes of other on-type static induction transistors, said channel being disposed between said main electrodes, and said capacitor connected between said gate of each of said static induction transistors and the corresponding one of said row lines;
means for reverse-biasing said gates when a signal is read out from each of said picture elements; and
automatic control loop means for controlling the output of each of said light-shielded picture elements such that said output becomes zero and for automatically controlling the output voltage of each of said means for applying row selecting control signals in accordance with the output of a corresponding light-shielded picture element.

2. A solid-state image sensing apparatus according to claim 1, wherein said automatic control loop means includes a comparator means which makes comparison between the output of each of said light-shielded picture elements and a reference voltage.

3. A solid-state image sensing apparatus comprising:
a plurality of row lines;
means for applying row selecting control signals to said row lines;
a plurality of column lines;
means for applying column selecting control signals to said column lines;
a plurality of picture elements, including at least one light-shielded picture element, each of said picture elements comprising normally-on type static induction transistors, each of said static induction transistors comprising a first layer of a substrate forming a first main electrode, a second layer of a channel disposed on said substrate, a source formed on the surface of the second layer forming a second main electrode and a gate formed within the second layer adjacent said channel, an insulator disposed on said gate, gate electrodes disposed on said insulator forming a capacitor therebetween, said second main electrode connected to a corresponding one of said column lines, said first main electrode connected commonly to respective first electrodes of other on-type static induction transistors, said channel being disposed between said main electrodes, and said capacitor connected between said gate of each of said static induction transistors and the corresponding one of said row lines;
means for reverse-biasing said gates when a signal is read out from each of said picture elements; and
automatic control loop means for controlling the output of each of said light-shielded picture elements such that said output becomes zero, said automatic control loop means includes a comparator means which makes comparisons between the output of each of said light-shielded picture elements and a reference voltage.

4. A solid-state image sensing apparatus according to claims 1 or 3, wherein said light-shielded picture elements are constituted by said picture elements which are connected to a given row line.

5. A solid-state image sensing apparatus according to claims 1 or 3, wherein said light-shielded picture elements are constituted by said picture elements which are connected to a given column line.

* * * * *